United States Patent [19]

Bertotti et al.

[11] Patent Number: 4,740,821
[45] Date of Patent: Apr. 26, 1988

[54] NPN EQUIVALENT STRUCTURE WITH BREAKDOWN VOLTAGE GREATER THAN THE INTRINSIC BREAKDOWN VOLTAGE OF NPN TRANSISTORS

[75] Inventors: Franco Bertotti; Maurizio Zuffada, both of Milan; Paolo Ferrari, Gallarate, all of Italy

[73] Assignee: SGS Microelettronica S.p.A., Catania, Italy

[21] Appl. No.: 22,273

[22] Filed: Mar. 5, 1987

[30] Foreign Application Priority Data

Mar. 21, 1986 [IT] Italy ................... 83611 A/86

[51] Int. Cl.[4] .................................. H01L 29/80
[52] U.S. Cl. ........................... 357/22; 357/48; 357/44; 307/570
[58] Field of Search ............... 357/22 F, 22 G, 44, 357/48; 307/570

[56] References Cited

U.S. PATENT DOCUMENTS

| 4,313,065 | 2/1982 | Yoshida | 307/570 X |
| 4,564,855 | 1/1986 | Van Zanten | 357/48 |
| 4,661,723 | 4/1987 | Masuda | 307/570 X |

Primary Examiner—Martin H. Edlow
Attorney, Agent, or Firm—Bierman & Muserlian

[57] ABSTRACT

Described is an improved NPN equivalent structure with a breakdown voltage higher than the intrinsic breakdown voltage of the NPN transistor utilizing a complementary PNP transistor and a JFET transistor with the gate connected to ground, the drain connected to the base of the PNP and the source connected to the collectors of the complementary pair. An integrated form of the structure is particularly advantageous and the equivalent NPN transistor is substantially exempt from Early effect and has improved output current capacity.

3 Claims, 1 Drawing Sheet

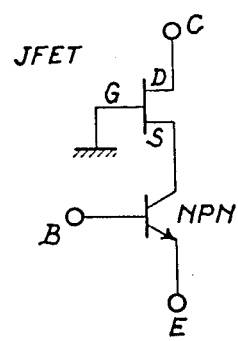
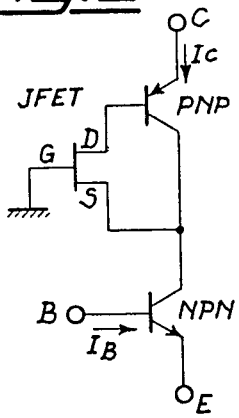
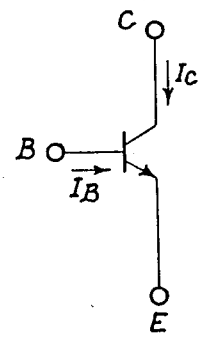
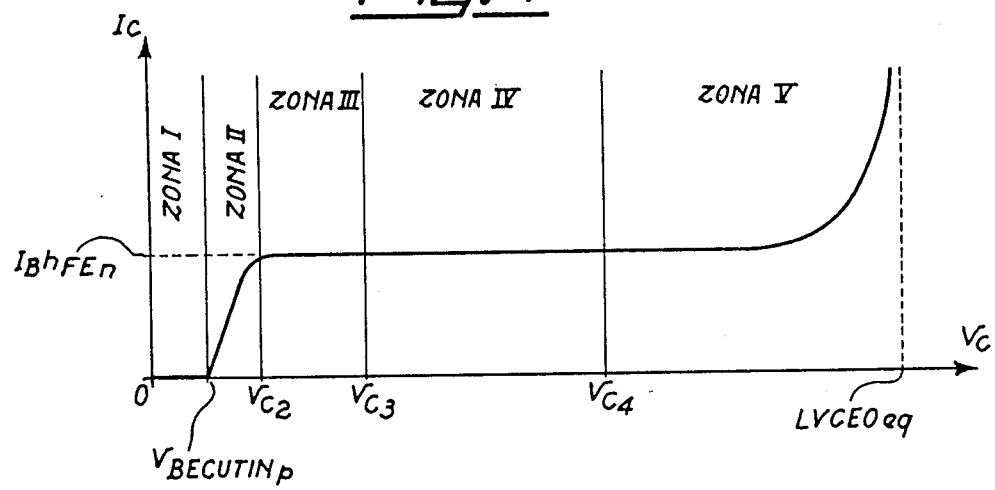
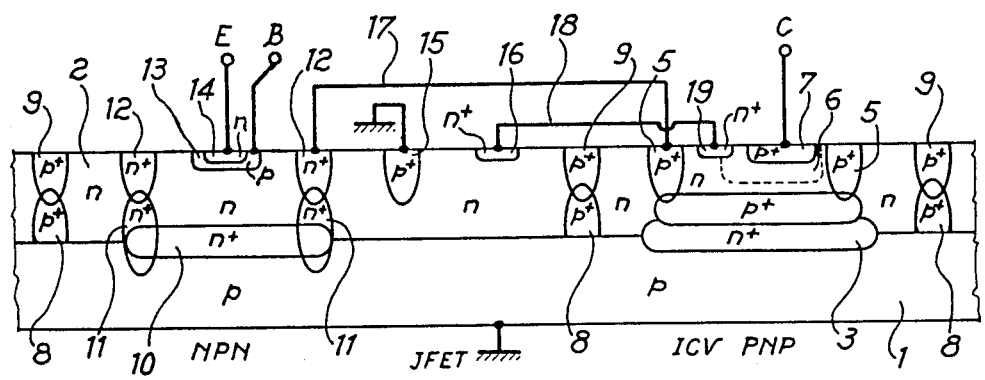

NPN EQUIVALENT STRUCTURE WITH BREAKDOWN VOLTAGE GREATER THAN THE INTRINSIC BREAKDOWN VOLTAGE OF NPN TRANSISTORS

The present invention relates to semiconductor devices and, more particularly, to integrated circuits containing complementary bipolar type transistors and more precisely NPN transistors from which a high breakdown voltage is required.

The growing tendency to increase the degree of integration of electronic apparatuses as well as the density of integration for obvious reasons of miniaturization and economy, creates the necessity of looking for new solutions to various design problems found in trying to make compatible often contrasting or anyway different requirements of distinct circuit sections which, ever more frequently, are being formed on the same chip of semiconductor material.

One of the problems often encountered during the designing of an integrated device, arises from the necessity of a certain circuit section, e.g. an output buffer, of withstanding a certain overvoltage, e.g. in the order of 100 V, when the remaining portion of the integrated circuit, which may comprise decoding and signals handling stages for example, could advantageously and with better performances be realized by a fabrication process designed for a supply voltage of just 12 V, for example. In practical terms, such frequent situations often mean that such a circuit section requiring a high breakdown voltage and which often represents just a minimum percentage, in terms of occupied area, of the whole area of the entire integrated circuit, dictates the recourse to a fabrication process suited to such a high voltage for the whole device.

This may also mean a device of increased dimensions being the density of integration of a process for high voltage normally smaller than the density of integration of a process for lower voltages. Furthermore, the current density in devices produced by a high voltage process is comparably lower and this implies a further increase of the area requirement of the device.

A typical component of such output circuit sections in integrated circuits which is determinant in terms of breakdown voltage is the NPN transistor.

With the aim of obviating such limitations imposed by the NPN structures, a number of expedients have been proposed for increasing, specifically, the breakdown voltage of NPN structures designed to drive relatively high voltages as compared to their intrinsic breakdown voltage, so that a fabrication process and integrated structures designed for generally lower voltages could be used for the whole integrated circuit.

According to the prior technique, such a result is obtained by connecting a JFET (Junction type, Field Effect Transistor) with grounded gate in series to the collector of the NPN transistor in question, as shown schematically in FIG. 1.

In this way, the collector - emitter voltage (VCE) of the NPN equivalent transistor, "spreads" itself over the series of drain and source junctions (JFET) and collector and emitter junctions (NPN), thus increasing the maximum voltage withstood by the NPN equivalent structure.

This known solution has, however, some disadvantages in that the maximum current which may be delivered by the NPN equivalent transistor is limited by the maximum permissible current through the JFET transistor.

In many applications, especially in output stages of a certain power rating, the limitation of the deliverable current causes a problem. It is therefore a main objective of the present invention to provide an improved system for increasing the breakdown voltage of a NPN equivalent transistor, as compared to the intrinsic breakdown voltage of the NPN transistor, free of the cited disadvantages.

It is a further objective of the present invention to provide an improved integrated structure for making an integrated NPN equivalent transistor with a high breakdown voltage and high output current capacity.

It is also an objective of the invention to provide a NPN equivalent transistor substantially exempt from Early effect.

These objectives and advantages are obtained, in accordance with the present invention, by a circuit arrangement comprising an NPN transistor, a PNP transistor and a junction type, field effect transistor (JFET), wherein the collector of the PNP transistor is connected to the collector of the NPN transistor and the JFET transistor has its source connected to the collectors of the two bipolar transistors, its drain connected to the base of the PNP transistor and its gate connected to ground.

As it will be described later in detail, the NPN equivalent transistor of the invention is not just easily integrated; but it lends itself to being realized in a particularly effective and compact integrated form.

For purely illustrative and not limitative purposes, the description shall proceed making reference to the annexed drawings, wherein:

FIG. 1 shows a prior art circuit arrangement for increasing the operating voltage tolerable by a NPN transistor;

FIG. 2 shows a circuit arrangement or device of the invention;

FIG. 3 shows the equivalent transistor corresponding to the circuit arrangement of FIG. 2;

FIG. 4 shows a $I_C$-$V_C$ characteristic curve of the NPN equivalent transistor illustrated in FIG. 3; and FIG. 5 shows, in a schematic way, the section of a particularly preferred embodiment of the circuit or device of the present invention in an integrated form.

In FIG. 1 is shown the commonly used circuit, according to the prior technique, for increasing the breackdown voltage of the NPN equivalent as compared to the intrinsic breakdown voltage. Terminals B, E and C indicate the base, emitter and collector terminals of the NPN equivalent transistor, respectively.

As already mentioned, the major drawback of such a circuit is represented by the limitation imposed on the maximum collector current of the equivalent transistor which is determined by:

$$I_{CMAX} = I_{DSSJFET}$$

In FIG. 2 is shown the circuit diagram of the device of the invention wherein B, E and C indicate the base, emitter and collector terminals, respectively, of the NPN equivalent transistor shown in FIG. 3.

The advantages of such a device are multiple. In the first place, the current gain of the equivalent transistor ($h_{FEeq}$) is substantially equal to the gain of the NPN transistor ($h_{FEn}$). The breakdown voltage of the equivalent transistor $LVCEO_{eq}$ is more or less equal to the sum of the intrinsic breakdown voltage of the NPN transistor and of the intrinsic breakdown voltage of the PNP transistor, that is:

$$LVCEO_{eq} = LVCEO_n + LVCEO_p$$

(the subscripts n or p indicate relation to the NPN or to the PNP transistors respectively, throughout the whole present specification, where not differently indicated).

Surprisingly, also the Early effect of the NPN equivalent structure results exceptionally small and practically negligeable.

For better understanding the effectiveness of the device of the invention, the operation of the circuit, e.g. with emitter connected to ground, may be analized.

As it is known, the fundamental equations are:

$$h_{FEn} I_B = (h_{FEp} + 1) I_{DS} \qquad (1)$$

$$V_C = V_S + V_{DS} + \frac{KT}{q} \ln\left(\frac{I_C}{A_p J_{sp}}\right) \qquad (2)$$

wherein the symbols are those customarily used in the related literature and wherein, in particular, $A_p$ is the emitter area of the PNP transistor and $J_{sp}$ is the inverse saturation current density of the emitter-base junction of the PNP transistor.

An arbitrary characteristic curve for $I_B$=constant, in the $I_C$, $V_C$ plane, is shown in FIG. 4.

For ease of description, it is possible to divide such a plane into five separate zones defined by straight lines given by the equations: $V_C$=constant=$V_{BECUTINp}$, $V_{C2}$, $V_{C3}$, $V_{C4}$ and LVCEO$_p$; as shown in the diagram of FIG. 4.

By fixing the base current $I_B$ at a value $I_B < I_{DSS}$ and increasing $V_C$ with continuity in the halfplane $V_C \geq 0$, a first zone I is encountered, which is comprised between the origin and the voltage $V_{BECUTINp}$, wherein $I_C=0$. That is, the total collector current is null until the voltage $V_C$ reaches and becomes greater than the voltage $V_{BECUTINp}$ of the PNP transistor (which is about 0.7 V in the case of silicon).

By increasing the voltage $V_C$ beyond the $V_{BECUTINp}$, the collector current begins to grow and the voltage $V_C - V_{BECUTINp}$ distributes itself so as to increase both the voltages $V_S$ and $V_{DS}$ satisfying the equations (1) and (2). This saturation zone II is characterized by a collector current growing with the collector voltage and terminates as soon as the voltage $V_S$ reaches a value such as to take out the NPN transistor from its saturation zone, that is when the voltage $V_S$ has reached a minimum value beyond which the current gain of the NPN transistor ($h_{FEn}$) results independent from $V_S$. That is the zone II terminates when:

$$V_{C2} = \frac{KT}{q} \ln\left(\frac{h_{FEn} I_B}{A_p J_{sp}}\right) + V_{DS}^* + V_{CESATn} \qquad (3)$$

where $V_{DS}^*$ is that point on the JFET characteristics wherein:

$$I_{DS} = I_{DS}^* = \frac{h_{FEn}}{(h_{FEp} + 1)} \cdot I_B \qquad (4)$$

$$V_{GS} = -V_{CESATn} \qquad (5)$$

beyond that point, that is for $V_C > V_{C2}$, there is a zone III, wherein any increase of the voltage $V_C$ distibutes itself over the voltages $V_{DS}$ and $V_S$ so as to move the current $I_{DS}$ over a straight line in the $I_{DS}$, $V_{DS}$ plane, characterized by $I_{DS} = I_{DS}^*$ = constant.

This zone III of the characteristic, is characterized by the fact that both the $V_S$ and $V_{DS}$ grow together with $V_C$, while the $I_C$ remains constant and equal to: $I_C = h_{FEn} \cdot I_B$.

Zone III terminates when:

$$V_{C3} = \frac{KT}{q} \ln\left(\frac{h_{FEn} I_B}{J_{sp} A_p}\right) + |V_p| \qquad (6)$$

where $V_p$ is the pinch-off voltage between source and drain of the JFET for a voltage $V_{GS}=0$ (that is with gate connected to ground).

When $V_C = V_{C3}$, the JFET has reached its saturation zone.

Beyond that point, i.e. for $V_C > V_{C3}$, the JFET operates in saturation zone therefore its current-voltage characteristic curve is given by the following equation:

$$I_{DS} = I_{DSS} \left(1 - \frac{V_s}{|V_p|}\right)^2 \qquad (7)$$

being the gate of the JFET grounded.

By combining the equation (7) with the equation (1) the following equation is obtained:

$$V_S^* = |V_p| \left(1 - \sqrt{\frac{h_{FEn} I_B}{(h_{FEp} + 1) I_{DSS}}}\right) \qquad (8)$$

Therefore, this zone IV is characterized by the fact that any increase of the voltage $V_C$ increases the voltage $V_{DS}$, while the voltage $V_S$ remains constant at the value established by the equation (8). Consequently, because the voltage $V_S$ remains constant, the NPN transistor is not subject to base modulations and therefore no Early effect is observed on the output current $I_C$.

This zone IV terminates at $V_C = V_{C4}$; wherein $V_{C4} = V_S^* + $LVCEOp.

When the voltage $V_C$ becomes greater than $V_{C4}$, the PNP transistor begins to increase its collector current through a breakdown mechanism, however, the current: $I_C = h_{FEn} \cdot I_B$, cannot grow indiscriminately in so far it is imposed by the NPN transistor.

Therefore, in this zone V, all the voltage $V_C$ exceeding $V_{C4}$, increments the voltage $V_S$ which decreases the base current of the PNP transistor thus choking the JFET channel.

In this zone, the collector current $I_C$ continues to be constant until the voltage $V_S$ is such as to reach the voltage: LVCEOn of the NPN transistor.

Therefore, the effective breakdown of the NPN equivalent transistor will be given by the following equation:

$$LVCEO_{eq} \approx LVCEOp + LVCEOn \qquad (9)$$

In FIG. 5 is shown, schematically in section, the architecture of an NPN equivalent structure object of the present invention in a particularly preferred integrated form thereof.

The integrated structure of the invention is formed on a p-type, monocrystalline silicon substrate 1 which is connected to ground. The low doping level epitaxial layer 2 is of n type silicon.

In the case of an integrated form embodiment of the circuital device of the present invention, it is essential to utilize a PNP transistor having a vertical structure and isolated collector. This is necessary because a PNP transistor with a lateral type structure offers only a single junction between the base region and the substrate, in contrast to that, the vertical PNP structure offers advantageously two junctions in series between base and substrate.

The structure of the vertical PNP transistor with isolated collector (ICV PNP) is shown in the right-hand part of FIG. 5 and is composed by a n+ buried layer 3 (bottom-n-well) for isolating the collector from the grounded substrate 1, by a p+ buried layer 4, laid on top of the isolation layer 3, and which represents the collector region of the transistor, the contact being brought to the surface by means of the deep p+ diffusion 5 along the perimeter of the buried region 4.

A dopant enriched region 6 (top-n-well) surrounds the p+ diffusion 7 representing the emitter region of the ICV PNP transistor, in order to reduce the base resistance of the transistor.

The bottom isolation 8 and top isolation 9 p+ diffusions surround the integrated structure, thus defining the tub of the ICV PNP transistor.

In the left-hand part of the section, the structure of the NPN transistor may be observed, which is composed by the collector contact represented by the n+ buried layer 10 and by the n+ diffusions 11 and 12 for surfacing the contact.

The collector region of the NPN transistor is represented by the n epitaxial layer, the base region by the p diffusion 13 and the emitter region by the n diffusion 14. Internally of the tub containing the NPN transistor, a p+ diffusion 15 and a n+ diffusion 16 are also made (the p+ diffusion 15, conveniently, during the making of the p+ top isolation diffusions 9 and the p+ diffusions 5).

By connecting the p+ diffusion 15 to ground through the top ground metallization layer of the device, the structure of a junction type, field effect transistor (JFET) is realized inside the same tub of the NPN transistor.

The JFET gate is represented by the p+ diffusion 15 and by the substrate 1, both being connected to ground, while the source and drain are respectively represented by the n+ regions 12 and 11 and by the n+ region 16. Therefore, the FET's channel is the region of the n silicon epitaxial layer between the substrate and the lower vertex of the p+ diffusion 15.

The structure is completed by the metallization of the device. The connection 17 between the collector of the NPN transistor, which also represents the source of the JFET, and the collector of the ICV PNP transistor and the connection 18 between the drain of the JFET and the base of the ICV PNP transistor are shown in FIG. 5. A n+ contact diffusion 19 allows the formation of an ohmic contact between the metal and the silicon in the base region of the ICV PNP transistor.

In FIG. 5 are also indicated with the letters E, B, and C, respectively, the emitter, base and collector terminals of the integrated NPN equivalent structure, object of the present invention.

Though the preferred embodiment of the invention, relative to the case of integrated circuits, has been described in detail because it is in such a field of application that the invention offers the greatest advantages, it is intended that the circuital device, that is the NPN equivalent transistor object of the invention, may be useful also in other situations, e.g. in circuits made entirely or partially with discrete components.

We claim:

1. A NPN equivalent transistor comprising a NPN transistor and a PNP transistor connected together through the respective collectors and a junction type, field effect transistor with grounded gate having the source connected to said collectors and the drain connected to the base of the PNP transistor;

the base terminal of the NPN equivalent transistor corresponding to the base of said NPN transistor;

the emitter terminal of said NPN equivalent transistor corresponding to the emitter of said NPN transistor; and the collector terminal of said NPN equivalent transistor corresponding to the emitter of said PNP transistor.

2. A semiconductor device comprising a plurality of circuital elements formed on a single monocrystalline semiconductor substrate, characterized by comprising a NPN equivalent structure constituted by a NPN transistor and a PNP transistor with isolated collector connected together through the respective collectors and by a junction type, field effect transistor with grounded gate having the source connected to said collectors and the drain connected to the base of the PNP transistor;

the base terminal of the NPN equivalent structure corresponding to the base of said NPN transistor;

the emitter terminal of said NPN equivalent structure corresponding to the emitter of said NPN transistor; and the collector terminal of said NPN equivalent structure corresponding to the emitter of said PNP transistor.

3. A semiconductor structure constituting a NPN equivalent transistor according to claim 2, and comprising a monocrystalline p silicon substrate connected to ground and a n silicon epitaxial layer wherein a vertical structure NPN transistor and a vertical structure PNP transistor with isolated collector are formed inside respective tubs defined by isolation regions of heavily doped p+ silicon extending through the whole thickness of said epitaxial layer, and characterized in that, inside the tub containing the structure of said NPN transistor and outside a n+ silicon contact region of the collector of said NPN transistor representing the source of said junction type, field effect transistor, is formed a p+ silicon region, obtained by deep diffusion, which extends from the surface of the epitaxial layer toward the substrate for a depth corresponding to at least half of the thickness of said epitaxial layer, and is connected to ground, a n+ diffusion, constituting the drain of said junction type, field effect transistor, is formed in a location adjacent to said deep p+ diffusion, on the opposite side of that of said n+ contact region, constituting the source of said junction type, field effect transistor, the gate of which is constituted by said deep p+ diffusion and by the substrate itself both being connected to ground;

an electrical path connects said n+ contact region of the collector of the NPN transistor and of source of the field effect transistor with the collector of said PNP transistor; and another electrical path connects said drain of the field effect transistor to the base of said PNP transistor.

* * * * *

UNITED STATES PATENT AND TRADEMARK OFFICE
CERTIFICATE OF CORRECTION

PATENT NO. : 4,740,821
DATED : April 26, 1988
INVENTOR(S) : FRANCO BERTOTTI; MAURIZIO ZUFFADA and PAOLO FERRARI It is certified that error appears in the above-identified patent and that said Letters Patent is hereby corrected as shown below:

| Col. | Line | |
|---|---|---|
| 2 | 35 to 37 | "Fig. 1 shows a prior art circuit arrangement for increasing the operating voltage tolerable by a NPN transistor; " should be<br><br>--Fig. 1 shows as already commented in the premeable, a circuital arrangement of the prior technique for increasing the operating voltage tolerable by a NPN transistor;-- |
| 2 | 45 | "circuit" should be --circuital-- also delete "or" |
| 3 | 37 | "$V_C \not\approx 0$" should be --$V_C \not= 0$-- |
| 4 | 8&9 | "$I_C = h_{FEn} \cdot I_B$" should be --$I_C = h_{FEn} \cdot I_B$-- |

Signed and Sealed this

Eleventh Day of October, 1988

Attest:

DONALD J. QUIGG

*Attesting Officer*　　　　*Commissioner of Patents and Trademarks*